United States Patent
Alloulah et al.

(10) Patent No.: US 12,155,482 B2
(45) Date of Patent: Nov. 26, 2024

(54) HIERARCHICAL DEEP CHANNEL CODING

(71) Applicant: NOKIA SOLUTIONS AND NETWORKS OY, Espoo (FI)

(72) Inventors: Mohammed Alloulah, Cambridge (GB); Aliye Özge Kaya, Chatham, NJ (US); Murhaf Hossari, Mountain View, CA (US)

(73) Assignee: NOKIA SOLUTIONS AND NETWORKS OY, Espoo (FI)

( * ) Notice: Subject to any disclaimer, the term of this patent is extended or adjusted under 35 U.S.C. 154(b) by 0 days.

(21) Appl. No.: 18/130,156

(22) Filed: Apr. 3, 2023

(65) Prior Publication Data

US 2023/0336275 A1 Oct. 19, 2023

Related U.S. Application Data

(60) Provisional application No. 63/331,600, filed on Apr. 15, 2022.

(51) Int. Cl.
*H04L 1/00* (2006.01)

(52) U.S. Cl.
CPC .......... *H04L 1/0076* (2013.01); *H04L 1/0061* (2013.01)

(58) Field of Classification Search
CPC ... H04L 1/0076; H04L 1/0061; H04L 1/1822; H04L 1/1819; H04L 1/1887; G06N 3/042; G06N 3/0455; G06N 3/044; H03M 13/09; H03M 13/6597; H03M 13/6306
USPC .................................................. 714/755, 776
See application file for complete search history.

(56) References Cited

U.S. PATENT DOCUMENTS

| | | | |
|---|---|---|---|
| 11,375,242 B1* | 6/2022 | Said | H04N 19/91 |
| 2005/0157822 A1* | 7/2005 | Khandekar | H04L 27/3488 |
| | | | 375/340 |
| 2005/0176436 A1* | 8/2005 | Mantravadi | H04J 11/004 |
| | | | 455/450 |
| 2013/0301599 A1* | 11/2013 | Valentin | H04L 1/007 |
| | | | 370/329 |
| 2019/0149239 A1* | 5/2019 | Tehrani | G06F 17/18 |
| | | | 398/183 |
| 2019/0149390 A1* | 5/2019 | Torbatian | H04L 27/362 |
| | | | 375/298 |
| 2019/0394793 A1* | 12/2019 | Venugopal | H04L 1/1671 |
| 2021/0319286 A1* | 10/2021 | Gunduz | H04N 19/30 |

(Continued)

FOREIGN PATENT DOCUMENTS

| | | |
|---|---|---|
| WO | 2009069087 A1 | 6/2009 |
| WO | 2021083521 A1 | 5/2021 |

OTHER PUBLICATIONS

Extended European Search Report dated Jun. 26, 2023, corresponding to European Patent Application No. 23166422.8.

(Continued)

*Primary Examiner* — Albert Decady
*Assistant Examiner* — Osman M Alshack
(74) *Attorney, Agent, or Firm* — SQUIRE PATTON BOGGS (US) LLP

(57) ABSTRACT

Systems, methods, apparatuses, and computer program products for hierarchical coding. One method may include encoding, by a layer-0 autoencoder, bit sequence x into a layer-0 codeword. The method may further include transmitting, by the layer-0 autoencoder, the layer-0 codeword over a channel, and decoding, by the layer-0 decoder, a received layer-0 codeword.

9 Claims, 7 Drawing Sheets

(56) References Cited

U.S. PATENT DOCUMENTS

| | | | |
|---|---|---|---|
| 2021/0351863 A1* | 11/2021 | Gunduz | H03M 13/6312 |
| 2022/0014300 A1* | 1/2022 | Torbatian | H04J 14/0212 |
| 2022/0393795 A1* | 12/2022 | Goutay | H04L 1/16 |
| 2022/0416937 A1* | 12/2022 | Andrews | H04B 1/0003 |
| 2022/0416941 A1* | 12/2022 | Banin | H04L 1/0041 |

OTHER PUBLICATIONS

Jannis Clausius et al: "Serial vs. Parallel Turbo-Autoencoders and Accelerated Training for Learned Channel Codes", arxiv.org, Cornell University Library, 201 Olin Library Cornell University Ithaca, NY 14853, Jul. 22, 2021 (Jul. 22, 2021).

Leung Cheuk Ting et al: "Multi-Label and Concatenated Neural Block Decoders", 2020 IEEE International Symposium on Information Theory (ISIT), IEEE, Jun. 21, 2020 (Jun. 21, 2020), pp. 274-279.

Jan Geldmacher et al: "Hard decision based low SNR early termination for LTE Turbo decoding", Wireless Communication Systems (ISWCS), 2011 8th International Symposium on, IEEE, Nov. 6, 2011 (Nov. 6, 2011), pp. 26-30.

Almahamdy Mohammed et al: "Early Termination of Turbo Decoding by Identification of Undecodable Blocks", 2017 IEEE Wireless Communications and Networking Conference (WCNC), IEEE, Mar. 19, 2017 (Mar. 19, 2017), pp. 1-6.

Hiyeji Kim et al., "Communication Algorithms via Deep Learning", Sixth International Conference on Learning Representations (ICLR), 2018, pp. 1-17.

Hiyeji Kim et al., "Deepcode: Feedback Codes via Deep Learning", IEEE Journal on Selected Areas in Information Theory, 2020, pp. 1-16.

\* cited by examiner

HIERARCHICAL DEEP CHANNEL CODING

CROSS REFERENCE TO RELATED APPLICATION

This application claims the benefit of U.S. Provisional Application No. 63/331,600, filed on Apr. 15, 2022. The entire content of the above-referenced application is hereby incorporated by reference.

TECHNICAL FIELD

Some example embodiments may generally relate to mobile or wireless telecommunication systems, such as 3rd Generation Partnership Project (3GPP) Long Term Evolution (LTE), 5th generation (5G) radio access technology (RAT), new radio (NR) access technology, 6th generation (6G) RAT, and/or other communications systems. For example, certain example embodiments may relate to systems and/or methods for hierarchical coding.

BACKGROUND

Examples of mobile or wireless telecommunication systems may include 5G RAT, 6G RAT, the Universal Mobile Telecommunications System (UNITS) Terrestrial Radio Access Network (UTRAN), LTE Evolved UTRAN (E-UTRAN), LTE-Advanced (LTE-A), LTE-A Pro, NR access technology, and/or MulteFire Alliance. 5G wireless systems refer to the next generation (NG) of radio systems and network architecture. A 5G system is typically built on a 5G NR, but a 5G (or NG) network may also be built on E-UTRA radio. It is expected that NR can support service categories such as enhanced mobile broadband (eMBB), ultra-reliable low-latency-communication (URLLC), and massive machine-type communication (mMTC). NR is expected to deliver extreme broadband, ultra-robust, low-latency connectivity, and massive networking to support the Internet of Things (IoT). The next generation radio access network (NG-RAN) represents the RAN for 5G, which may provide radio access for NR, LTE, and LTE-A. It is noted that the nodes in 5G providing radio access functionality to a user equipment (e.g., similar to the Node B in UTRAN or the Evolved Node B (eNB) in LTE) may be referred to as next-generation Node B (gNB) when built on NR radio, and may be referred to as next-generation eNB (NG-eNB) when built on E-UTRA radio.

SUMMARY

In accordance with some example embodiments, a method may include encoding, by a layer-0 autoencoder, bit sequence x into a layer-0 codeword. The method may further include transmitting, by the layer-0 autoencoder, the layer-0 codeword over a channel. The method may further include decoding, by the layer-0 decoder, a received layer-0 codeword.

In accordance with certain example embodiments, an apparatus may include means for encoding bit sequence x into a layer-0 codeword. The apparatus may further include means for transmitting the layer-0 codeword over a channel. The apparatus may further include means for decoding a received layer-0 codeword.

In accordance with various example embodiments, a non-transitory computer readable medium may be encoded with instructions that may, when executed in hardware, perform a method. The method may include encoding bit sequence x into a layer-0 codeword. The method may further include transmitting the layer-0 codeword over a channel. The method may further include decoding a received layer-0 codeword.

In accordance with some example embodiments, a computer program product may perform a method. The method may include encoding bit sequence x into a layer-0 codeword. The method may further include transmitting the layer-0 codeword over a channel. The method may further include decoding a received layer-0 codeword.

In accordance with certain example embodiments, an apparatus may include at least one processor and at least one memory including computer program code. The at least one memory and the computer program code may be configured to, with the at least one processor, cause the apparatus to at least encode bit sequence x into a layer-0 codeword. The at least one memory and the computer program code may be further configured to, with the at least one processor, cause the apparatus to at least transmit the layer-0 codeword over a channel. The at least one memory and the computer program code may be further configured to, with the at least one processor, cause the apparatus to at least decode a received layer-0 codeword.

In accordance with various example embodiments, an apparatus may include circuitry configured to encode bit sequence x into a layer-0 codeword. The circuitry may further be configured to transmit the layer-0 codeword over a channel. The circuitry may further be configured to decode a received layer-0 codeword.

BRIEF DESCRIPTION OF THE DRAWINGS

For a proper understanding of example embodiments, reference should be made to the accompanying drawings, wherein.

DETAILED DESCRIPTION

Figure 1:
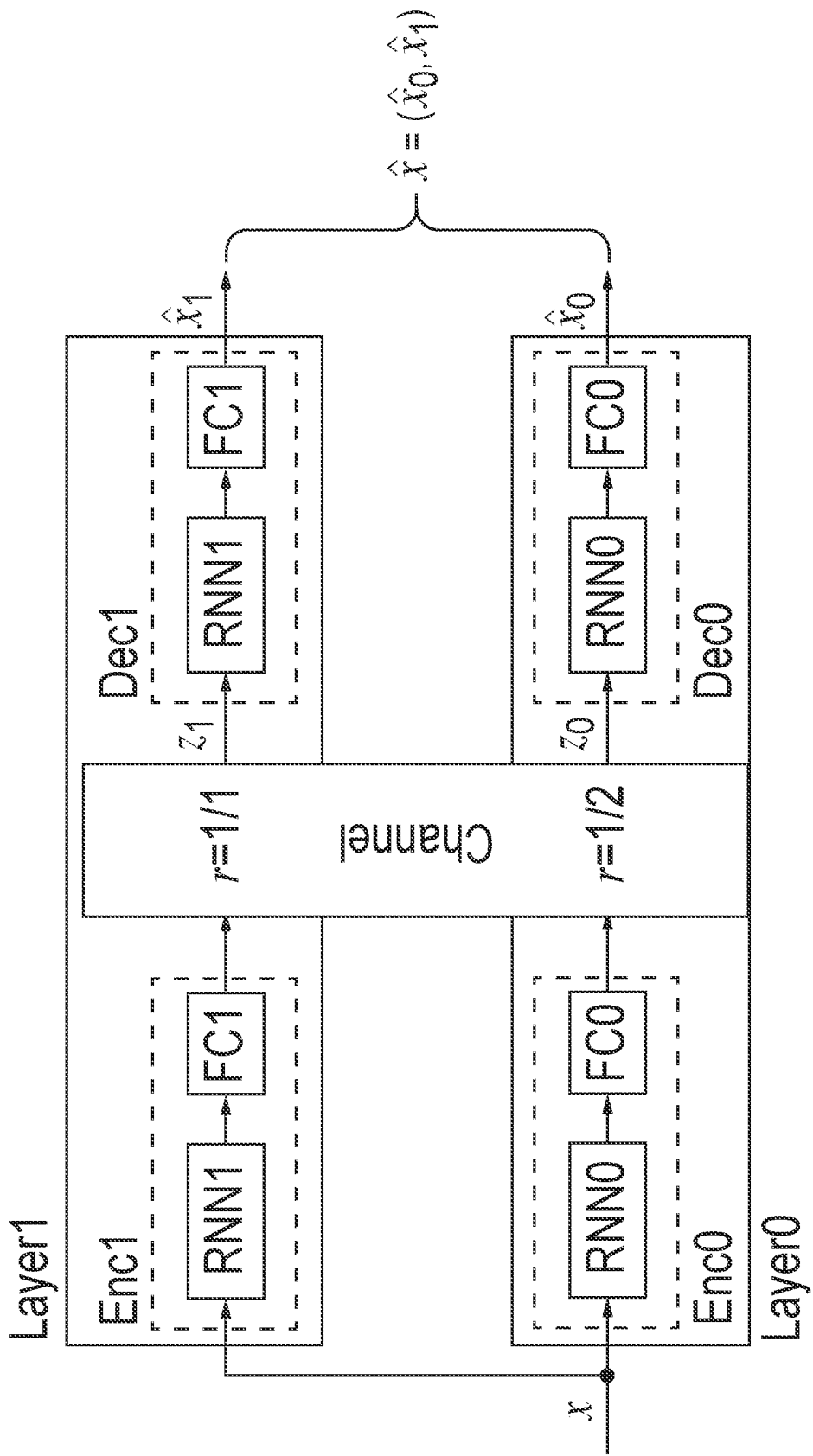
FIG. 1 illustrates an example of hierarchical recurrent neural network channel coding.

It will be readily understood that the components of certain example embodiments, as generally described and illustrated in the figures herein, may be arranged and designed in a wide variety of different configurations. Thus, the following detailed description of some example embodiments of systems, methods, apparatuses, and computer program products for hierarchical channel coding is not intended to limit the scope of certain example embodiments, but is instead representative of selected example embodiments.

In general, channel coding may protect a bit stream of equally-important bits from transmission errors, and deliver them quasi-error-free (QEF). The problem of channel coding includes three blocks: an encoder, a channel, and a decoder. The encoder maps the binary sequence x of length K into a codeword z of length N. The channel may corrupt the codeword due to the fading and noise. The decoder then maps the received sequence x to the transmitted sequence. Thus, the goal of channel coding is to construct the codeword z such that the decoder maps it successfully to the sequence x.

Channel coding can be applied to wireless communications, including with turbo code, low-density parity-check (LDPC) code, and/or polar code. These codes have been shown to be near-optimal (e.g., in Shannon channel capacity) with increasing code lengths on additive white Gaussian noise (AWGN) channels.

6G cellular data network standards may require channel codes suitable for low-latency constraints, which could support augmented reality (AR)/virtual reality (VR) applications and/or URLLC. For block codes, latency is proportional to block length; the decoder may wait until it receives the entire codeword to start the decoding. Thus, short block lengths may be desired for URLLC. Traditional high-performance codes, such as LDPC and turbo codes, may rely on Shannon channel capacity only for high block lengths. As a result, LDPC and turbo codes may exhibit poor performance under URLLC requirements, and may be challenged by practical (e.g., non-AWGN) channel models.

Machine learning (ML) techniques may replace the channel encoder and/or decoder with neural networks. Overall, ML-based codes may outperform conventional channel codes. However, while conventional codes may excel at short block lengths such as convolutional codes, the gains may be limited.

Hybrid automatic repeat request (HARQ) may be used in traditional networks for error correction. For Type 1 HARQ (e.g., chase combining), forward error correction (FEC) bits may be added to each message before transmission. FEC bits may be sent with error detection (ED) bits. If the channel is high quality, such bits could introduce unnecessary overhead; alternatively, if the channel is low quality, not all errors can be corrected and the transmitter may be asked for retransmission.

In Type 2 and Type 3 HARQ, different subsets of data, ED bits, and FEC bits may be sent on each re-transmission. For example, in the first transmission, a subset of information is sent. Re-transmissions may be sent with a different set of data, ED bits, and FEC bits. In Type 2 HARQ, redundancy may be added on each re-transmission, and the receiver may need to decode each of them to obtain packets. In Type 3 HARQ, each re-transmission may be sufficient to decode data, and re-transmission may be made only if the channel conditions are low quality and/or data was incorrectly decoded. This HARQ process relies upon receiving an acknowledgement (ACK) message for the packets. In one process (e.g., stop and wait (SAW)), the sender may send a packet, and then wait for the ACK before sending another packet. SAW may increase the round-trip time (e.g., sender processing time+receiver processing time+propagation delay); thus, multiple SAW processes may be used such that, when one SAW process is waiting for ACK, another SAW process can transmit data. These multiple SAW processes may also be referred to as HARQ processes. Type 2 and Type 3 HARQ attempt to resolve the latency associated with SAW processes. HARQ can compensate for signal transmission errors caused by complex time-varying channels and multi-path effects of wireless communication networks, but can result in suboptimal feedback. For both traditional channel coding and ML-based coding state-of-the-art (SOTA) techniques, a transmission may be repeated if it is not successful, which may result in resending of bits which have already been received successfully again. While some approaches may include the decoder output being fed back to the encoder with some delay, the gains may be limited.

Certain example embodiments described herein may have various benefits and/or advantages to overcome at least the disadvantages described above. For example, certain example embodiments may improve the block error rate performance of SOTA ML-based coding for short block lengths. Some example embodiments may also eliminate redundant feedback mechanisms for improved spectral efficiency. Thus, certain example embodiments discussed below are directed to improvements in computer-related technology.

Various example embodiments described herein may include a hierarchical channel coding approach as a concatenation of two channel autoencoders (AEs) that incorporate feedback from layer-0 to layer-1. Specifically, a layer-0 encoder may create feedback, such as log-likelihood ratios (LLRs) and/or any compressed LLR-like metric. The layer-0 encoder may also condition the layer-1 encoder and/or decoder, or any stacked hierarchy thereof. Based on feedback from the layer-0 encoder, the layer-1 encoder may encode a retransmission sequence that is designed jointly to remove residual errors from layer-0. In addition, learned recurrent neural network (RNN) codes may be combined with conditional feedback to support iterative error refinement, which may provide a desired balance between decoding performance and channel resource overhead.

Figure 2:
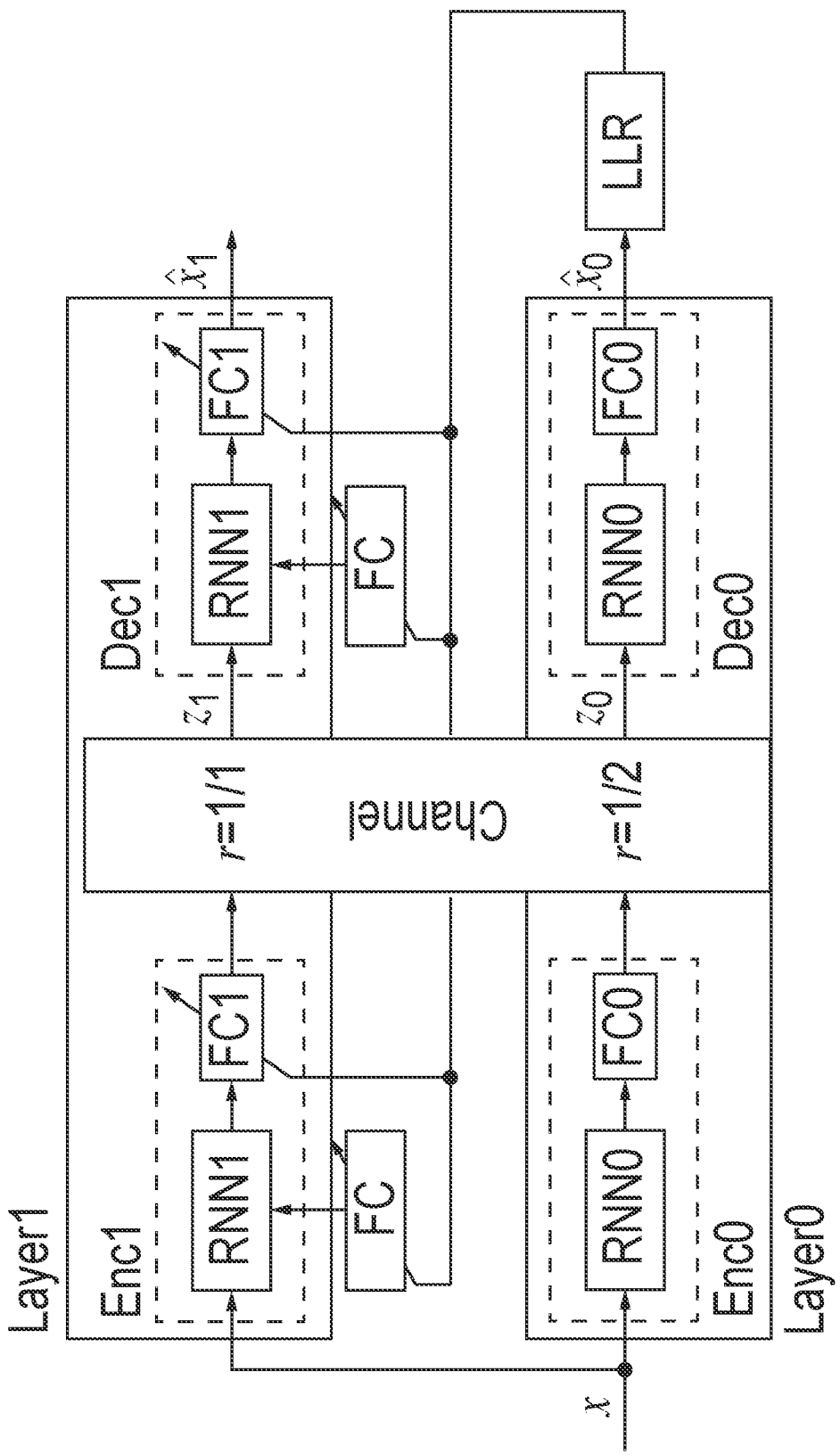
FIG. 2 illustrates an example of a structure of a hierarchical channel encoder with feedback.

FIG. 1 illustrates an example of the structure of a hierarchical channel AE, wherein a codeword is encoded with different rates for each layer. Two instances of RNN-based channel AEs may be hierarchically processed in space. Specifically, layer-0 may generate soft feedback in the form of LLRs, as shown in FIG. 2. The soft feedback may be raw LLR values, quantized versions thereof, and/or any other manipulation thereof (e.g., via compression). The soft feedback may then be fed to the encoder and decoder of layer-1. The feedback may be generated using probabilistic conditioning (e.g., instantaneous parametrization) of the components of layer-1. This framework could be generalized to any hierarchy of N stacked layers. Within such a hierarchy, each layer may transmit a progressively shorter sequence with respect to its preceding layer.

Figure 3:
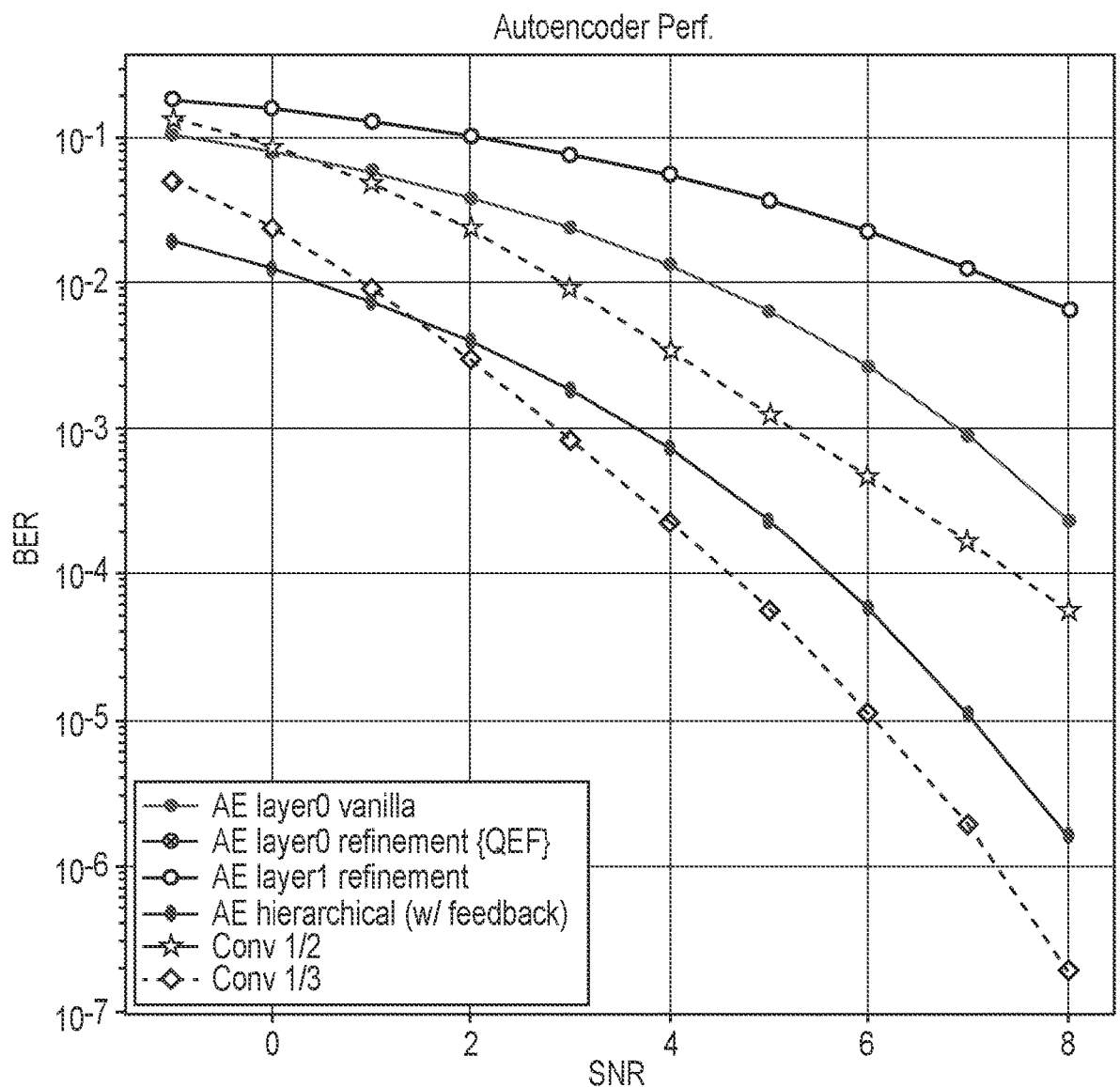
FIG. 3 illustrates an example of block error rate performance of a hierarchical autoencoder compared with a single layer autoencoder and convolutional codes.
Figure 4:
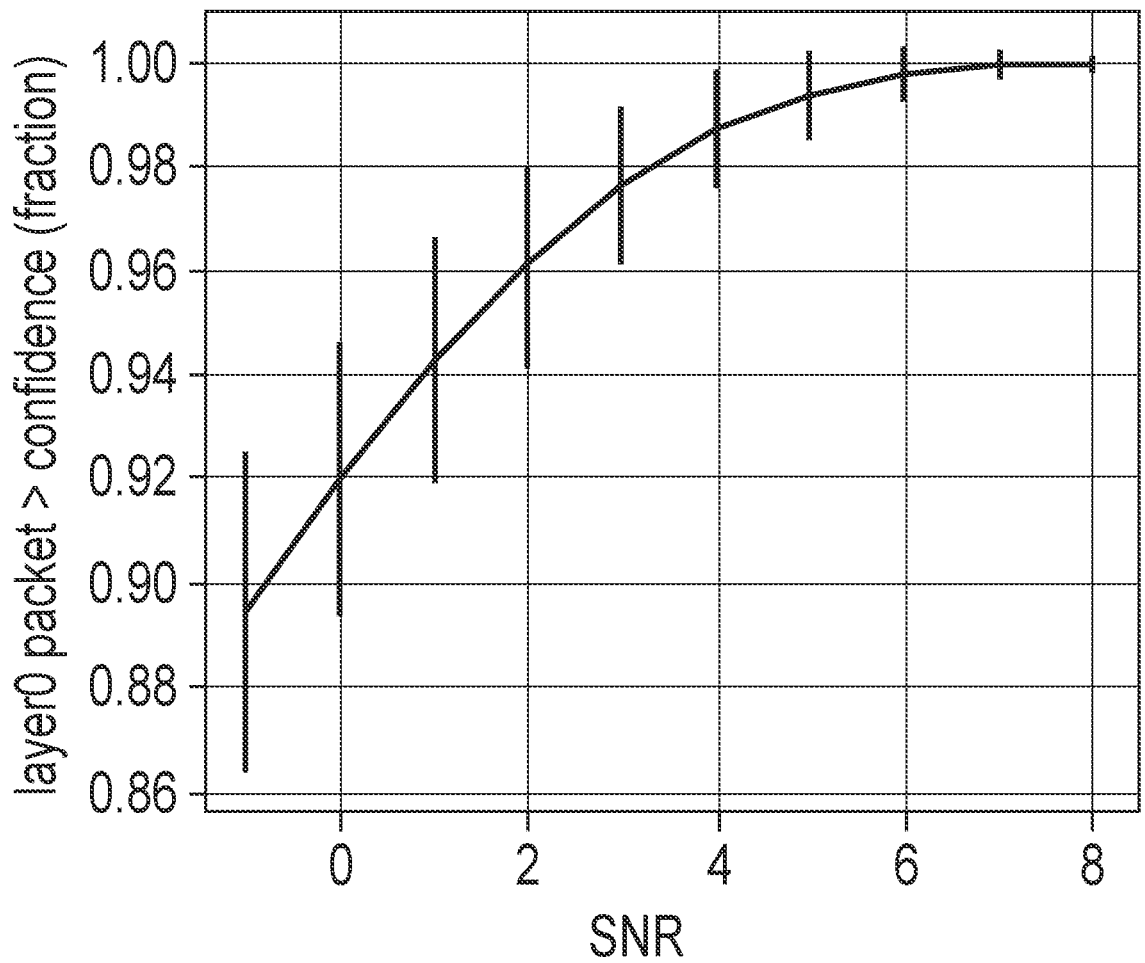
FIG. 4 illustrates an example of layer-0 packets above confidence level across signal-to-noise ratio.

FIG. 3 illustrates the performance of some example hierarchical AE embodiments discussed herein. The performance is analysed against two baselines based around convolutional codes with rates 1/2 and 1/3. The overall performance of various example hierarchical AE embodiments may be between that of convolutional codes rate 1/2 and rate 1/3-outperforming the former and bounded by the later-since not all packets from layer-0 need a layer-1 retransmission. The entire hierarchical scheme may also be trained jointly and end-to-end. Various curriculum learning techniques (e.g., signal-to-noise ratio (SNR) scheduling, layer-0 annealing, codebook regularisation) may be utilized in order to ensure successful hierarchical training. Furthermore, as shown in FIG. 4, 90% of packets at layer-0 do not need a second transmission; that is, 10% of packets at low SNR may require retransmission on layer-1. Thus, some example hierarchical AE embodiments may outperform convolutional code with rate 1/3 for low SNR.

Figure 5:
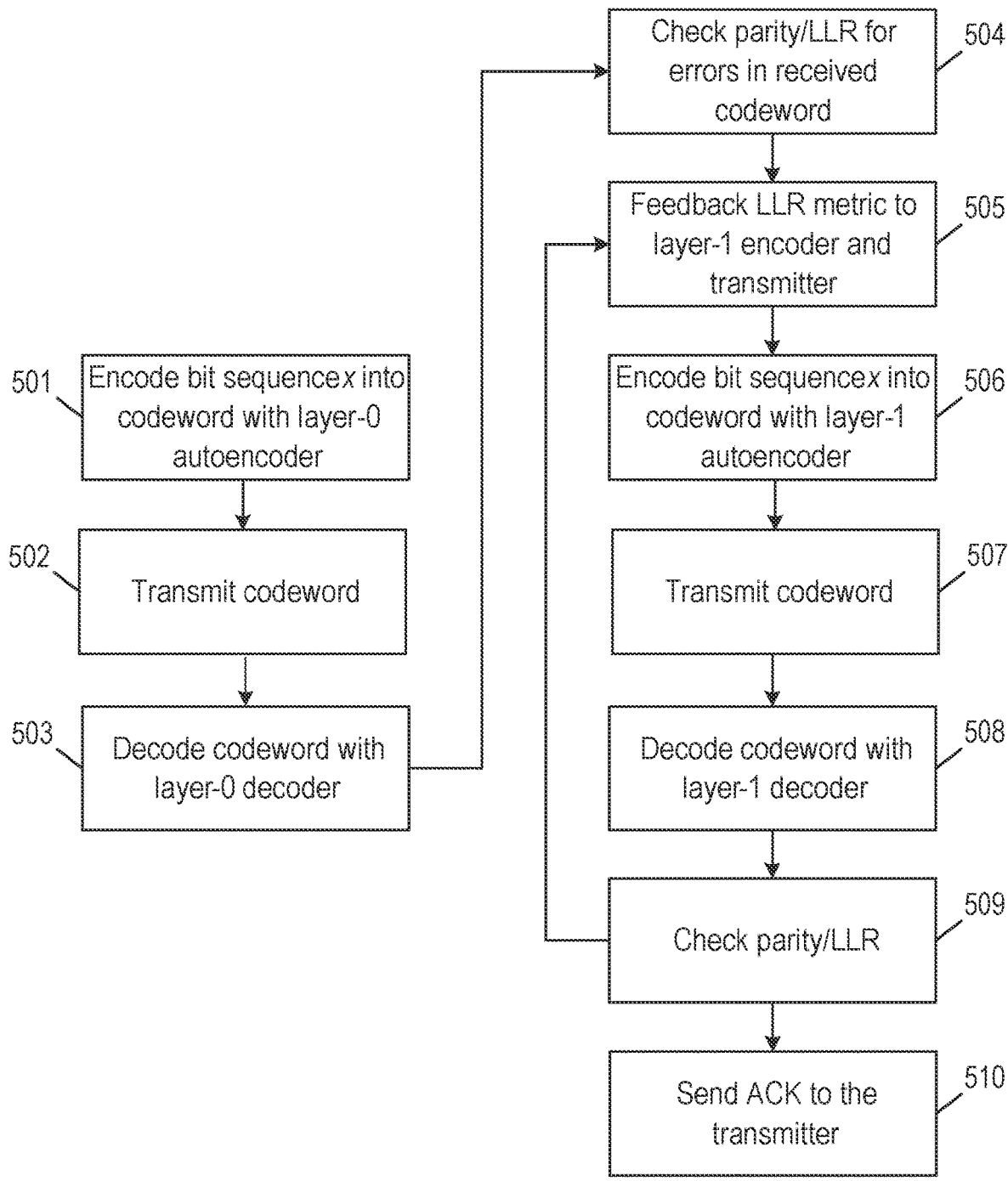
FIG. 5 illustrates an example of a flow diagram of a method according to various example embodiments.
Figure 6:
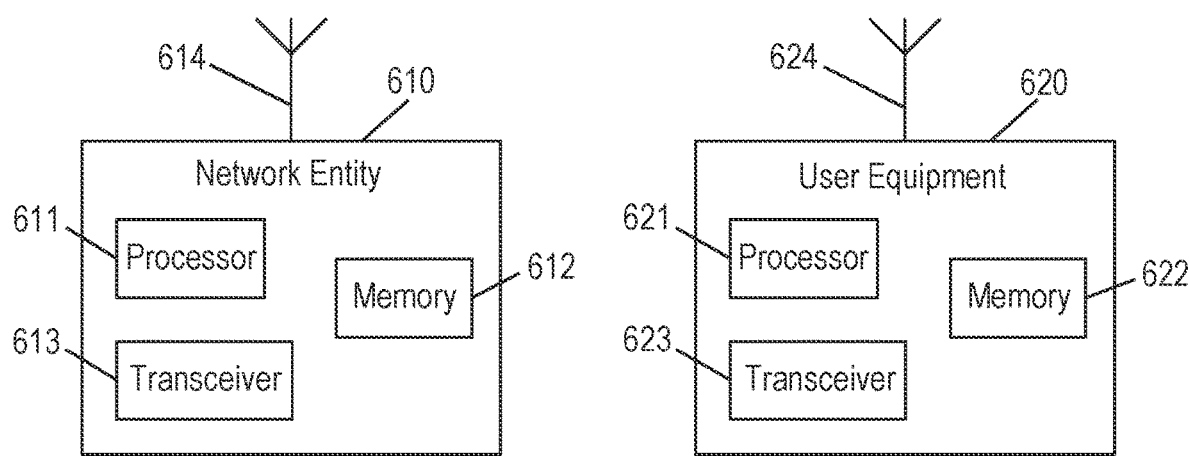
FIG. 6 illustrates an example of various network devices according to some example embodiments.

FIG. 5 illustrates an example of a flow diagram of a method that may be performed by a NE, such as NE 610, or a UE, such as UE 620, illustrated in FIG. 6, according to various example embodiments.

At step 501, the method may include encoding, by a layer-0 AE, bit sequence x into a layer-0 codeword, and at step 502, transmitting the layer-0 codeword over a channel. At step 503, the method may include decoding, by a layer-0 decoder, a received layer-0 codeword.

The method may include, at step 504, checking parity and/or LLR values to determine, for example, if errors exist in the received layer-0 codeword. At step 505, upon determining that errors exist in the received layer-0 codeword, a layer-1 AE may be activated, and feedback LLR metrics may be fed back to an encoder and decoder of the layer-1 AE configured to condition its operation.

Referring back to FIG. 1, the probability of the decoded bit stream at layer-1 may be a joint distribution of sequential bits. That is, the output of the RNN-based decoder has a joint probability which may be factorized (e.g., using the chain rule) as a product of conditional probabilities, which may be according to $$p(\hat{x}_1) = \Pi_{t=0}^{T-1} p(\hat{x}_1^t | \hat{x}_1^0, \ldots, \hat{x}_1^{t-1}),$$

where the subscript denotes layer-1, and the superscript denotes bit order in a sequence.

Feedback may be effected at layer-1 by conditioning the joint probability distribution on layer-0 LLRs, which may be according to $$p(\hat{x}_1 | llr_0) = \Pi_{t=0}^{T-1} p(\hat{x}_1^t | \hat{x}_1^0, \ldots, \hat{x}_1^{t-1}, llr_0).$$

Similarly, the output of the RNN-based encoder of layer-1 may have a joint probability distribution which can be conditioned on layer-0 LLRs, which may be according to $$p(z_1 | llr_0) = \Pi_{t=0}^{T-1} p(z_1^t | z_1^0, \ldots, z_1^{t-1}, llr_0).$$

Such feedback is illustrated in FIG. 2 by diagonal arrows. Some example embodiments may also be RNN-specific, and/or may be targeted at other architectures, such as graph neural networks (GNNs).

At step 506, the method may include encoding, by the layer-1 AE, the bit sequence x into a layer-1 codeword, and at step 507, transmitting the layer-1 codeword. In some example embodiments, the layer-1 codeword may have fewer bits than the layer-0 codeword. As a result, the layer-1 retransmission may require fewer channel resources. At step 508, the method may include decoding, by the layer-1 decoder, the layer-1 codeword, and at step 509, checking if the layer-1 codeword is received correctly, for example, by parity and/or LLR values. In some example embodiments, if the layer-1 codeword is determined to have been received incorrectly, the method may revert to step 505 and repeat the process until a threshold is exceeded and/or the layer-1 codeword is determined to have been received correctly. At step 510, after determining that the layer-1 codeword has been received correctly, the method may include sending an ACK to a transmitter.

FIG. 6 illustrates an example of a system according to certain example embodiments. In various example embodiments, a system may include multiple devices, such as, for example, NE 610 and/or UE 620.

NE 610 may be one or more of a base station, such as an eNB or gNB, a serving gateway, a server, and/or any other access node or combination thereof.

NE 610 may further comprise at least one gNB-CU, which may be associated with at least one gNB-DU. The at least one gNB-CU and the at least one gNB-DU may be in communication via at least one F1 interface, at least one $X_n$-C interface, and/or at least one NG interface via a 5GC.

UE 620 may include one or more of a mobile device, such as a mobile phone, smart phone, personal digital assistant (PDA), tablet, or portable media player, digital camera, pocket video camera, video game console, navigation unit, such as a global positioning system (GPS) device, desktop or laptop computer, single-location device, such as a sensor or smart meter, or any combination thereof. Furthermore, NE 610 and/or UE 620 may be one or more of a citizens broadband radio service device (CBSD).

NE 610 and/or UE 620 may include at least one processor, respectively indicated as 611 and 621. Processors 611 and 621 may be embodied by any computational or data processing device, such as a central processing unit (CPU), application specific integrated circuit (ASIC), or comparable device. The processors may be implemented as a single controller, or a plurality of controllers or processors.

At least one memory may be provided in one or more of the devices, as indicated at 612 and 622. The memory may be fixed or removable. The memory may include computer program instructions or computer code contained therein. Memories 612 and 622 may independently be any suitable storage device, such as a non-transitory computer-readable medium. The term "non-transitory," as used herein, may correspond to a limitation of the medium itself (i.e., tangible, not a signal) as opposed to a limitation on data storage persistency (e.g., random access memory (RAM) vs. read-only memory (ROM)). A hard disk drive (HDD), random access memory (RAM), flash memory, or other suitable memory may be used. The memories may be combined on a single integrated circuit as the processor, or may be separate from the one or more processors. Furthermore, the computer program instructions stored in the memory, and which may be processed by the processors, may be any suitable form of computer program code, for example, a compiled or interpreted computer program written in any suitable programming language.

Processors 611 and 621, memories 612 and 622, and any subset thereof, may be configured to provide means corresponding to the various blocks of FIGS. 1-5. Although not shown, the devices may also include positioning hardware, such as GPS or micro electrical mechanical system (MEMS) hardware, which may be used to determine a location of the device. Other sensors are also permitted, and may be configured to determine location, elevation, velocity, orientation, and so forth, such as barometers, compasses, and the like.

As shown in FIG. 6, transceivers 613 and 623 may be provided, and one or more devices may also include at least one antenna, respectively illustrated as 614 and 624. The device may have many antennas, such as an array of antennas configured for multiple input multiple output (MIMO) communications, or multiple antennas for multiple RATs. Other configurations of these devices, for example, may be provided. Transceivers 613 and 623 may be a transmitter, a receiver, both a transmitter and a receiver, or a unit or device that may be configured both for transmission and reception.

The memory and the computer program instructions may be configured, with the processor for the particular device, to cause a hardware apparatus, such as UE, to perform any of the processes described above (i.e., FIGS. 1-5). Therefore, in certain example embodiments, a non-transitory computer-readable medium may be encoded with computer instructions that, when executed in hardware, perform a process such as one of the processes described herein. Alternatively, certain example embodiments may be performed entirely in hardware.

In certain example embodiments, an apparatus may include circuitry configured to perform any of the processes or functions illustrated in FIGS. 1-5. For example, circuitry may be hardware-only circuit implementations, such as analog and/or digital circuitry. In another example, circuitry may be a combination of hardware circuits and software, such as a combination of analog and/or digital hardware circuitry with software or firmware, and/or any portions of hardware processors with software (e.g., including digital signal processors), software, and at least one memory that work together to cause an apparatus to perform various processes or functions. In yet another example, circuitry may be hardware circuitry and or processors, such as a microprocessor or a portion of a microprocessor, that includes software, such as firmware, for operation. Software in circuitry may not be present when it is not needed for the operation of the hardware.

Figure 7:
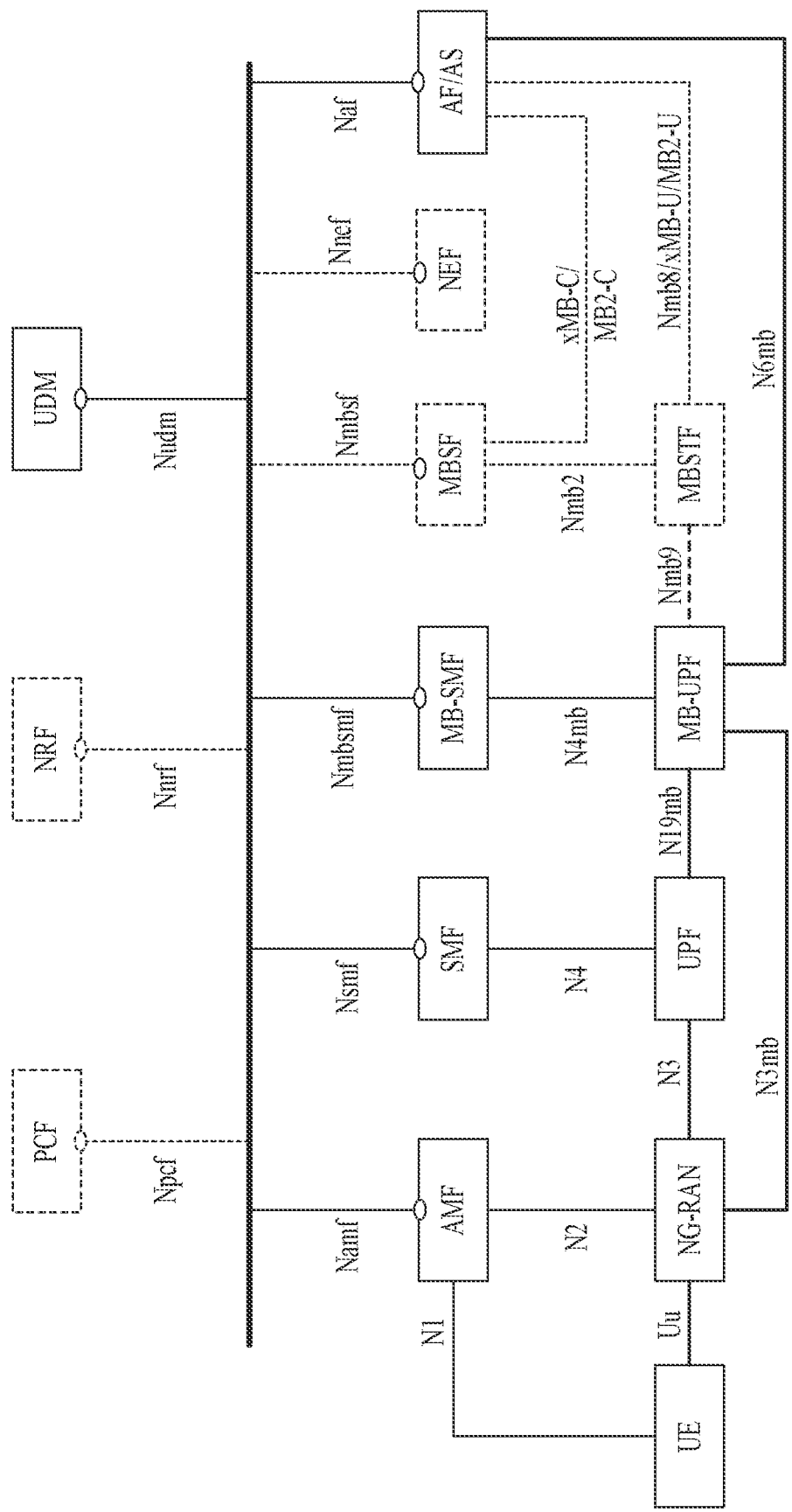
FIG. 7 illustrates an example of a 5G or 6G network and system architecture according to certain example embodiments.

FIG. 7 illustrates an example of a 5G or 6G network and system architecture according to certain example embodiments. Shown are multiple network functions that may be implemented as software operating as part of a network device or dedicated hardware, as a network device itself or dedicated hardware, or as a virtual function operating as a network device or dedicated hardware. The NE and UE illustrated in FIG. 7 may be similar to NE 610 and UE 620, respectively. The user plane function (UPF) may provide services such as intra-RAT and inter-RAT mobility, routing and forwarding of data packets, inspection of packets, user plane quality of service (QoS) processing, buffering of downlink packets, and/or triggering of downlink data notifications. The application function (AF) may primarily interface with the core network to facilitate application usage of traffic routing and interact with the policy framework.

According to certain example embodiments, processors 611 and 621, and memories 612 and 622, may be included in or may form a part of processing circuitry or control circuitry. In addition, in some example embodiments, transceivers 613 and 623 may be included in or may form a part of transceiving circuitry.

In some example embodiments, an apparatus (e.g., NE 610 and/or UE 620) may include means for performing a method, a process, or any of the variants discussed herein. Examples of the means may include one or more processors, memory, controllers, transmitters, receivers, and/or computer program code for causing the performance of the operations.

In various example embodiments, apparatus 610 may be controlled by memory 612 and processor 611 to encode bit sequence x into a layer-0 codeword, transmit the layer-0 codeword over a channel, and decode a received layer-0 codeword.

Certain example embodiments may be directed to an apparatus that includes means for performing any of the methods described herein including, for example, means for encoding bit sequence x into a layer-0 codeword, transmitting the layer-0 codeword over a channel, and means for decoding a received layer-0 codeword.

The features, structures, or characteristics of example embodiments described throughout this specification may be combined in any suitable manner in one or more example embodiments. For example, the usage of the phrases "various embodiments," "certain embodiments," "some embodiments," or other similar language throughout this specification refers to the fact that a particular feature, structure, or characteristic described in connection with some example embodiments may be included in at least one example embodiment. Thus, appearances of the phrases "in various embodiments," "in certain embodiments," "in some embodiments," or other similar language throughout this specification does not necessarily all refer to the same group of example embodiments, and the described features, structures, or characteristics may be combined in any suitable manner in one or more example embodiments.

As used herein, "at least one of the following: <a list of two or more elements>" and "at least one of <a list of two or more elements>" and similar wording, where the list of two or more elements are joined by "and" or "or," mean at least any one of the elements, or at least any two or more of the elements, or at least all the elements.

Additionally, if desired, the different functions or procedures discussed above may be performed in a different order and/or concurrently with each other. Furthermore, if desired, one or more of the described functions or procedures may be optional or may be combined. As such, the description above should be considered as illustrative of the principles and teachings of certain example embodiments, and not in limitation thereof.

One having ordinary skill in the art will readily understand that the example embodiments discussed above may be practiced with procedures in a different order, and/or with hardware elements in configurations which are different than those which are disclosed. Therefore, although some embodiments have been described based upon these example embodiments, it would be apparent to those of skill in the art that certain modifications, variations, and alternative constructions would be apparent, while remaining within the spirit and scope of the example embodiments.

PARTIAL GLOSSARY

3GPP Third Generation Partnership Project
5G Fifth Generation
5GC Fifth Generation Core
5GS Fifth Generation System
6G Sixth Generation
ACK Acknowledgement
AE Autoencoder
AMF Access and Mobility Management Function
AR Augmented Reality
ASIC Application Specific Integrated Circuit
AWGN Additive White Gaussian Noise
BER Block Error Rate
BS Base Station
CAPC Channel Access Priority Class
CBSD Citizens Broadband Radio Service Device
CCCH Common Control Channel
CE Control Elements
CG Configured Grant
CN Core Network
CPU Central Processing Unit
CRC Cyclic Redundancy Check
CU Centralized Unit
DAI Downlink Assignment Index
DCCH Dedicated Control Channel
DCI Downlink Control Information
DL Downlink
DMRS Demodulation Reference Signal
DRB Data Radio Bearer
ED Error Detection
eMBB Enhanced Mobile Broadband
eMTC Enhanced Machine Type Communication
eNB Evolved Node B
eOLLA Enhanced Outer Loop Link Adaptation
EPS Evolved Packet System
FEC Forward Error Correction
FR Frequency Range gNB Next Generation Node B
GNN Graph Neural Networks
GPS Global Positioning System
HARQ Hybrid Automatic Repeat Request
HDD Hard Disk Drive
IoT Internet of Things
IPTV Internet Protocol Television
L1 Layer-1
LDPC Low-density Parity Check
LLR Log-likelihood Ratio
LTE Long-Term Evolution
LTE-A Long-Term Evolution Advanced
MAC Medium Access Control
MBS Multicast and Broadcast Systems
MEMS Micro Electrical Mechanical System
MIMO Multiple Input Multiple Output
ML Machine Learning
MME Mobility Management Entity
mMTC Massive Machine Type Communication
MPDCCH Machine Type Communication Physical Downlink Control Channel
MTC Machine Type Communication
NB-IoT Narrowband Internet of Things
NE Network Entity
NG Next Generation
NG-eNB Next Generation Evolved Node B
NG-RAN Next Generation Radio Access Network
NR New Radio
NR-U New Radio Unlicensed
OFDM Orthogonal Frequency Division Multiplexing
OLLA Outer Loop Link Adaptation
PDA Personal Digital Assistance
QEF Quasi-Error-Free
RAM Random Access Memory
RAN Radio Access Network
RAT Radio Access Technology
RE Resource Element
RLC Radio Link Control
RNN Recurrent Neural Network
RRC Radio Resource Control
SAW Stop and Wait
SME Session Management Function
SNR Signal-to-Noise Ratio
SOTA State of the Art
TBCC Tail-biting Convolutional Code
TR Technical Report
TS Technical Specification
UE User Equipment
UMTS Universal Mobile Telecommunications System
URLLC Ultra-Reliable and Low-Latency Communication
UTRAN Universal Mobile Telecommunications System Terrestrial Radio Access Network
VR Virtual Reality
WLAN Wireless Local Area Network

We claim:

1. An apparatus, comprising:
at least one processor; and
at least one memory storing instructions that, when executed by the at least one processor, cause the apparatus at least to:
encode bit sequence x into a layer-0 codeword;
transmit the layer-0 codeword over a channel;
decode a received layer-0 codeword;
check at least one parity or log-likelihood ratio value to determine if errors exist in the received layer-0 codeword;
provide feedback log-likelihood ratio metrics to the encoder and a decoder of the layer-1 autoencoder;
encode the bit sequence x into a layer-1 codeword;
transmit the layer-1 codeword;
decode a received layer-1 codeword, wherein the layer-1 codeword has fewer bits than the layer-0 codeword;
determine that the layer-1 codeword has been received correctly according to the at least one parity or log-likelihood ratio value; and
in response to determining that the layer-1 codeword has been received correctly, transmit an acknowledgement to a transmitter.

2. The apparatus of claim 1, wherein the at least one memory and the instructions, when executed by the at least one processor, further cause the apparatus at least to:
upon determining that errors exist in the received layer-0 codeword, activate a layer-1 encoder.

3. The apparatus of claim 1, wherein the at least one memory and the instructions, when executed by the at least one processor, further cause the apparatus at least to:
upon determining that errors exist in the received layer-0 codeword, activate a layer-1 autoencoder.

4. A method, comprising:
encoding, by a layer-0 autoencoder, bit sequence x into a layer-0 codeword;
transmitting, by the layer-0 autoencoder, the layer-0 codeword over a channel;
decoding a received layer-0 codeword;
checking at least one parity or log-likelihood ratio value to determine if errors exist in the received layer-0 codeword;
providing feedback log-likelihood ratio metrics to the encoder and a decoder of the layer-1 autoencoder;
encoding, by the layer-1 autoencoder, the bit sequence x into a layer-1 codeword;
transmitting, by the layer-1 autoencoder, the layer-1 codeword;
decoding a received layer-1 codeword, wherein the layer-1 codeword has fewer bits than the layer-0 codeword;
determining that the layer-1 codeword has been received correctly according to the at least one parity or log-likelihood ratio value; and
in response to determining that the layer-1 codeword has been received correctly, transmitting an acknowledgement to a transmitter.

5. The method of claim 4, further comprising:
upon determining that errors exist in the received layer-0 codeword, activating a layer-1 encoder.

6. The method of claim 4, further comprising:
upon determining that errors exist in the received layer-0 codeword, activating a layer-1 autoencoder.

7. A non-transitory computer readable medium comprising program instructions stored thereon for performing at least the following:
encoding bit sequence x into a layer-0 codeword;
transmitting the layer-0 codeword over a channel;
decoding a received layer-0 codeword;
checking at least one parity or log-likelihood ratio value to determine if errors exist in the received layer-0 codeword;
providing feedback log-likelihood ratio metrics to the encoder and a decoder of the layer-1 autoencoder;
encoding the bit sequence x into a layer-1 codeword;
transmitting the layer-1 codeword;

decoding a received layer-1 codeword, wherein the layer-1 codeword has fewer bits than the layer-0 codeword;

determining that the layer-1 codeword has been received correctly according to the at least one parity or log-likelihood ratio value; and in response to determining that the layer-1 codeword has been received correctly, transmitting an acknowledgement to a transmitter.

8. The non-transitory computer-readable medium of claim 7, further comprising program instructions stored thereon for performing at least the following:

upon determining that errors exist in the received layer-0 codeword, activating a layer-1 encoder.

9. The non-transitory computer-readable medium of claim 7, further comprising program instructions stored thereon for performing at least the following:

upon determining that errors exist in the received layer-0 codeword, activating a layer-1 autoencoder.

* * * * *